United States Patent
Kim et al.

(10) Patent No.: US 8,519,484 B2
(45) Date of Patent: Aug. 27, 2013

(54) SEMICONDUCTOR DEVICES HAVING DUAL TRENCH, METHODS OF FABRICATING THE SAME, AND ELECTRONIC SYSTEM HAVING THE SAME

(75) Inventors: Dong-Won Kim, Suwon-si (KR); Jae-Hwang Sim, Hwaseong-si (KR); Keon-Soo Kim, Hwaseong-si (KR); Young-Ho Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/368,556

(22) Filed: Feb. 8, 2012

(65) Prior Publication Data

US 2012/0132976 A1    May 31, 2012

Related U.S. Application Data

(62) Division of application No. 12/951,490, filed on Nov. 22, 2010, now Pat. No. 8,129,238.

(30) Foreign Application Priority Data

Jan. 6, 2010    (KR) .................. 10-2010-0000997

(51) Int. Cl.
    *H01L 21/70* (2006.01)
(52) U.S. Cl.
    USPC .......... 257/374; 257/296; 257/301; 257/314; 257/E21.545; 257/E21.548; 257/501; 438/243; 438/248; 438/259; 438/389; 438/700
(58) Field of Classification Search
    USPC .................. 257/374, 501, E21.545, E21.548, 257/296, 301, 314; 438/243, 248, 259, 389, 438/700
    See application file for complete search history.

(56) References Cited

U.S. PATENT DOCUMENTS

| | | | | |
|---|---|---|---|---|
| 6,635,536 B2 * | 10/2003 | Shin et al. | | 438/276 |
| 6,646,328 B2 * | 11/2003 | Tsai | | 257/659 |
| 6,914,316 B2 * | 7/2005 | Yun et al. | | 257/506 |
| 7,033,909 B2 * | 4/2006 | Kim et al. | | 438/435 |
| 7,224,060 B2 * | 5/2007 | Zhang et al. | | 257/730 |

(Continued)

FOREIGN PATENT DOCUMENTS

| KR | 1020060038243 | 5/2006 |
|---|---|---|
| KR | 1020070018277 | 2/2007 |
| KR | 1020090011947 | 2/2009 |

OTHER PUBLICATIONS

"Semiconductor Devices Having Dual Trench, Methods of Fabricating the Same, and Electronic System Having the Same" Specification, Drawings,Claims and Prosecution History, of U.S. Appl. No. 12/951,490, filed Nov. 22, 2010, by Dong-Won Kim, et al.

*Primary Examiner* — Jarrett Stark
*Assistant Examiner* — Nicholas Tobergte
(74) *Attorney, Agent, or Firm* — Onello & Mello, LLP

(57) ABSTRACT

A semiconductor device having a dual trench and methods of fabricating the same, a semiconductor module, an electronic circuit board, and an electronic system are provided. The semiconductor device includes a semiconductor substrate having a cell region including a cell trench and a peripheral region including a peripheral trench. The cell trench is filled with a core insulating material layer, and the peripheral trench is filled with a padding insulating material layer conformably formed on an inner surface thereof and a core insulating material layer formed on an inner surface of the padding insulating material layer. The core insulating material layer has a greater fluidity than the padding insulating material layer.

13 Claims, 17 Drawing Sheets

(56) References Cited

U.S. PATENT DOCUMENTS

| | | | |
|---|---|---|---|
| 7,465,985 B2 * | 12/2008 | Choi et al. | 257/324 |
| 7,514,736 B2 | 4/2009 | Hong et al. | |
| 7,674,685 B2 * | 3/2010 | Choi et al. | 438/427 |
| 7,732,296 B2 * | 6/2010 | Park et al. | 438/393 |
| 7,932,149 B2 * | 4/2011 | Park et al. | 438/261 |
| 8,003,487 B2 * | 8/2011 | Cho et al. | 438/427 |
| 2005/0173749 A1 | 8/2005 | Seidl | |
| 2007/0218645 A1 | 9/2007 | Zhou | |
| 2008/0242045 A1 * | 10/2008 | Lee et al. | 438/435 |
| 2009/0170280 A1 * | 7/2009 | Park | 438/425 |

\* cited by examiner

SEMICONDUCTOR DEVICES HAVING DUAL TRENCH, METHODS OF FABRICATING THE SAME, AND ELECTRONIC SYSTEM HAVING THE SAME

RELATED APPLICATIONS

This application is a divisional application of U.S. patent application Ser. No. 12/951,490 filed on Nov. 22, 2010, which claims the benefit of Korean patent application Ser. No. 10/2010-0000997 filed on Jan. 6, 2010, in the Korean Intellectual Property Office, the contents of which applications are incorporated herein in their entirety by reference

BACKGROUND

1. Field

Exemplary embodiments relate to a semiconductor device having a dual trench and a method of fabricating the same, and a semiconductor module, an electronic circuit board and an electronic system having the same.

2. Description of Related Art

As the integration of semiconductor devices increases, various structures are applied and various materials are used. High-integration semiconductor devices may be formed of appropriate materials using appropriate structures.

SUMMARY

Exemplary embodiments provide a semiconductor device having a dual trench.

Exemplary embodiments also provide a semiconductor module including a semiconductor device having a dual trench.

Exemplary embodiments also provide an electronic circuit board including a semiconductor device having a dual trench.

Exemplary embodiments also provide an electronic system including a semiconductor device having a dual trench.

Exemplary embodiments also provide a method of fabricating a semiconductor device having a dual trench.

Additional aspects and/or advantages of the inventive concept will be set forth in part in the following detailed description and, in part, will be obvious from the description, or may be learned by practice of the inventive concept.

According to one aspect, the inventive concept is directed to a semiconductor device. The semiconductor device includes a semiconductor substrate having a cell region and a peripheral region, the cell region including a cell trench and the peripheral region including a peripheral trench. The cell trench is filled with a first core insulating material layer. The peripheral trench is filled with: i) a padding insulating material layer conformably formed on an inner surface of the peripheral trench, the padding insulating material layer having a relatively low fluidity, and ii) a second core insulating material layer formed on an inner surface of the padding insulating material layer, the second core insulating material layer having a relatively high fluidity.

In one embodiment, the semiconductor device further includes a lining insulating material layer conformably formed between the semiconductor substrate and the padding insulating material layer in the peripheral trench. The lining insulating material layer may include a silicon oxide layer.

In one embodiment, the padding insulating material layer comprises a silicate-based insulating material. The silicate-based insulating material may be undoped silicate glass (USG).

In one embodiment, at least one of the first and second core insulating material layers comprises a silazene-based insulating material. The silazene-based insulating material may include tonen silazene (TOSZ).

In one embodiment, the semiconductor device further includes a first insulating material layer formed on the semiconductor substrate and a first conductive material layer formed on the first insulating material layer. The trenches may extend into the semiconductor substrate and physically separate the first insulating material layer and the first conductive material layer. The trenches may physically separate the first conductive layer and the first insulating layer. The trenches may electrically isolate the first conductive layer.

According to another aspect, the inventive concept is directed to a semiconductor device. The semiconductor device includes a semiconductor substrate having a cell region and a peripheral region. The cell region includes a tunnel insulating layer formed on the semiconductor substrate, a floating gate electrode formed on the tunnel insulating layer, and a cell trench vertically passing through the floating gate electrode and the tunnel insulating layer and extending into the semiconductor substrate, the cell trench being filled with a silazene-based material. The peripheral region includes a peripheral gate insulating layer formed on the semiconductor substrate, a peripheral gate electrode formed on the peripheral gate insulating layer, and a peripheral trench vertically passing through the peripheral gate electrode and the peripheral gate insulating layer and extending into the semiconductor substrate, the peripheral trench being filled with a silicon oxide layer conformably formed on the semiconductor substrate, a silicate-based insulating material layer conformably formed on the silicon oxide layer, and a silazene-based insulating material formed on the silicate-based silicate material layer.

In one embodiment, the cell trench and sidewalls of the tunnel insulating layer are vertically aligned.

According to another aspect, the inventive concept is directed to a method of fabricating a semiconductor device, the method including: preparing a semiconductor substrate having a cell region and a peripheral region; forming a peripheral trench having a first size in the peripheral region; forming a cell trench having a second size smaller than the first size in the cell region; forming a padding insulating material layer having a relatively low fluidity on an inner wall of the peripheral trench; and filling an inner wall of the padding insulating material layer of the peripheral trench and the inside of the cell trench with a core insulating material layer having a relatively high fluidity.

In one embodiment, the method further comprises, before forming the padding insulating material layer, conformably forming a lining insulating layer on an inner wall of the peripheral trench. The lining insulating layer may be formed by oxidizing the surface of the semiconductor substrate.

In one embodiment, the padding insulating material layer is conformably formed through deposition of a silicate-based insulating material.

In one embodiment, the core insulating material layer is filled by coating a silazene-based insulating material.

According to another aspect, the inventive concept is directed to a method of fabricating a semiconductor device, comprising: preparing a semiconductor substrate having a cell region and a peripheral region; forming a first insulating material layer on the semiconductor substrate; forming a first conductive material layer on the first insulating material layer; forming a peripheral trench vertically passing through the first conductive material layer and the first insulating material layer and extending into the semiconductor substrate, in the peripheral region; forming a padding insulating material layer on the first conductive material layer of the cell region and an inner wall of the peripheral trench of the peripheral region; forming a cell trench vertically passing through the first conductive material layer and the first insulating material layer and extending into the semiconductor substrate, in the cell region; and filling the cell trench and the peripheral trench with a core insulating material layer.

In one embodiment, the method further comprises forming a second insulating material layer on the first conductive material layer, the cell trench, and the peripheral trench; and forming a second conductive material layer on the second insulating layer.

According to another aspect, the inventive concept is directed to a method of fabricating a semiconductor device, comprising: preparing a semiconductor substrate having a cell region and a peripheral region; forming a first insulating material layer on the semiconductor substrate; forming a first conductive material layer on the first insulating material layer; forming a peripheral trench vertically passing through the first conductive material layer and the first insulating material layer and extending into the semiconductor substrate, in the peripheral region; forming a lining insulating material layer on the first conductive material layer of the cell region and an inner wall of the peripheral trench of the peripheral region; forming a silicate-based insulating material layer on the lining insulating material layer; forming an intermediate material layer pattern on the silicate-based insulating material layer of the cell region and the silicate-based insulating material layer in the peripheral trench of the peripheral region; forming a cell trench vertically passing through the first conductive material layer and the first insulating material layer and extending into the semiconductor substrate, in the cell region; filling the cell trench and the peripheral trench with a silazene-based insulating material; and removing a portion of the silazene-based insulating material such that there is no silazene-based material on the surface of the first conductive material layer.

In one embodiment, the method further comprises: removing the intermediate material layer pattern before filling the silazene-based insulating material; removing the silazene-based insulating material from the surface of the first conductive material layer; forming a second insulating layer on the first conductive material layer, the cell trench, and the peripheral trench; patterning the second insulating material layer of the peripheral region and forming an opening exposing the surface of the first conductive material layer; and forming a second conductive material layer on the second insulating material layer to fill the opening.

According to another aspect, the inventive concept is directed to a semiconductor module including: a module substrate; semiconductor devices disposed on the module substrate; and module contact terminals formed in parallel at a corner of the module substrate and electrically connected to the semiconductor devices. The semiconductor device includes a semiconductor substrate having a cell region including a cell trench and a peripheral region including a peripheral trench. The cell trench is filled with a core insulating material layer, the peripheral trench is filled with a padding insulating material layer conformably formed on an inner surface thereof and a core insulating material layer formed on an inner surface of the padding insulating material layer, and the core insulating material layer has a greater fluidity than the padding insulating material layer.

According to another aspect, the inventive concept is directed to an electronic circuit board including: an electronic circuit board; a microprocessor disposed on the electronic circuit board; a storage circuit in communication with the microprocessor; an input signal processing circuit for sending a command to the microprocessor; an output signal processing circuit for receiving a command from the microprocessor; and a communication signal processing circuit for sending/receiving an electric signal to/from another circuit. The semiconductor device includes a semiconductor substrate having a cell region including a cell trench and a peripheral region including a peripheral trench. The cell trench is filled with a core insulating material layer, the peripheral trench is filled with a padding insulating material layer conformably formed on an inner surface thereof and a core insulating material layer formed on an inner surface of the padding insulating material layer, and the core insulating material layer has a greater fluidity than the padding insulating material layer.

According to another aspect, the inventive concept is directed to an electronic system including: a control unit; an input unit; an output unit; and a storage unit. At least one of the control unit and the storage unit includes a semiconductor substrate having a cell region including a cell trench and a peripheral region including a peripheral trench. The cell trench is filled with a core insulating material layer, the peripheral trench is filled with a padding insulating material layer conformably formed on an inner surface thereof and a core insulating material layer formed on an inner surface of the padding insulating material layer, and the core insulating material layer has a greater fluidity than the padding insulating material layer.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF EXAMPLE EMBODIMENTS

Figure 1:
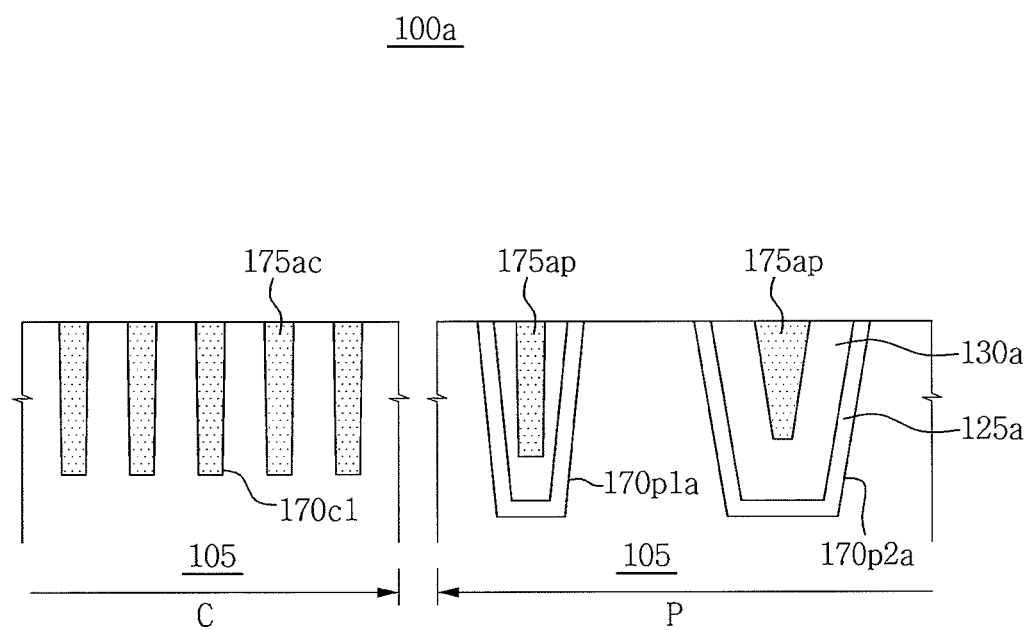
FIG. 1 is a schematic longitudinal cross-sectional view of a semiconductor device having a dual trench in accordance with an exemplary embodiment.

Detailed illustrative embodiments are described in detail herein. However, specific structural and functional details disclosed herein are merely representative for purposes of describing exemplary embodiments. This inventive concept, however, may be embodied in many alternate forms and should not be construed as limited to only exemplary embodiments set forth herein.

Accordingly, while exemplary embodiments are capable of various modifications and alternative forms, embodiments are shown by way of example in the drawings and will herein be described in detail. It should be understood, however, that there is no intent to limit exemplary embodiments to the particular forms described, but on the contrary, exemplary embodiments are to cover all modifications, equivalents, and alternatives falling within the scope of the inventive concept.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion, e.g., "between" versus "directly between," "adjacent" versus "directly adjacent," etc.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient. e.g., of implant concentration, at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the inventive concept is not limited to exemplary embodiments described.

FIG. 1 is a longitudinal cross-sectional view of a semiconductor device having a dual trench in accordance with an exemplary embodiment according to the inventive concept. Referring to FIG. 1, a semiconductor device 100a includes cell trenches 170c1 formed in a cell region C of a semiconductor substrate 105, and peripheral trenches 170p1a and 170p2a formed in a peripheral region P. The cell trenches 170e1 may be cell active isolation regions, and the peripheral trenches 170p1a and 170p2a may be peripheral active isolation regions. The peripheral trenches 170p1a and 170p2a may be larger, i.e., wider or deeper, than the cell trenches 170c1. The cell trenches 170c1 include a cell core insulating material layer 175ac. The cell trenches 170c1 may be completely filled with the cell core insulating material layer 175ac only. The cell core insulating material layer 175ac may be formed of a silazene-based material, for example, tonen silazene (TOSZ). The peripheral trenches 170p1a and 170p2a include a peripheral core insulating material layer 175ap and a padding insulating material layer 130a. The padding insulating material layer 130a may be formed of a silicate-based insulating material, for example, undoped silicate glass (USG). The padding insulating material layer 130a has a relatively lower fluidity than the peripheral core insulating material layer 175ap. The padding insulating material layer 130a may be conformably formed on inner sidewalls of the peripheral trenches 170p1a and 170p2a. The inner sidewalls are recessed surfaces of the semiconductor substrate 105. The core insulating material layer 175a may be formed in a shape filled into a cup shape of the padding insulating material layer 130a. That is, the cell trenches 170c1 may be filled with a silazene-based insulating material having a relatively high fluidity, and the peripheral trenches 170p1a and 170p2a may have a silicate-based material having a relatively low fluidity and formed on an interface with the semiconductor substrate 105, in which the silazene-based insulating material is filled. The peripheral trenches 170p1a and 170p2a may further include lining insulating material layers 125a formed on sidewalls and bottoms thereof. The sidewalls and bottoms of the peripheral trenches 170p1a and 170p2a are recessed surfaces of the semiconductor substrate 105. The lining insulating material layer 125a is formed of a material different from the peripheral core insulating material layer 175ap and the padding insulating material layer 130a or a material formed through a process different therefrom. The lining insulating material layer 125a may be formed in a liner shape. The padding insulating material layer 130a may be formed on an inner sidewall of the lining insulating material layer 125a, and the peripheral core insulating material layer 175ap may be formed on an inner sidewall of the padding insulating material layer 130a. The lining insulating material layer 125a may be formed of silicon oxide, and the semiconductor substrate 105 may have a surface formed by oxidation.

Figure 2A:
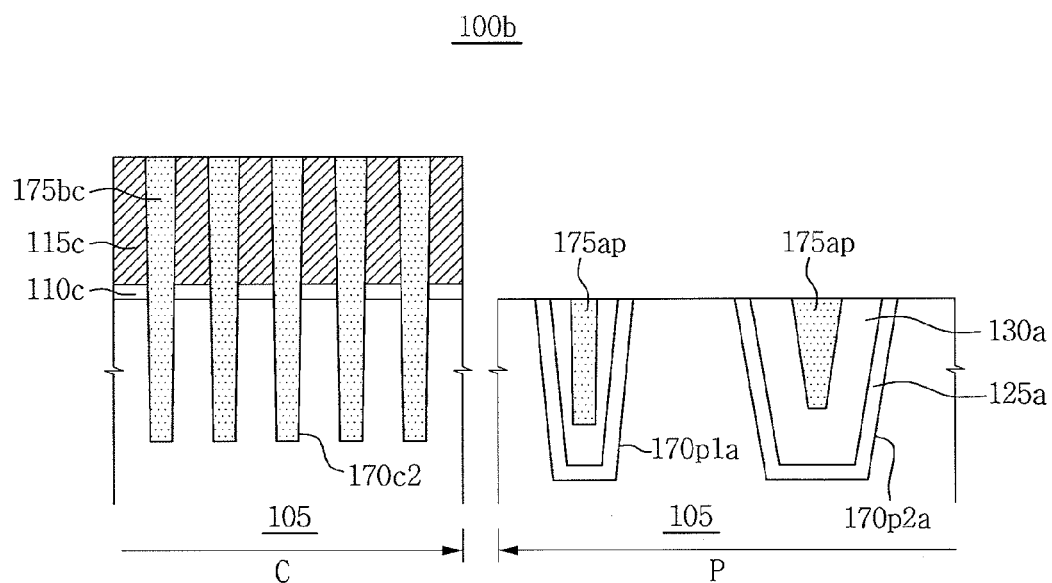
FIGS. 2A and 2B are a schematic longitudinal cross-sectional view of a semiconductor device having a dual trench and a schematic plan view of a cell region, respectively, in accordance with another exemplary embodiment.
Figure 2B:
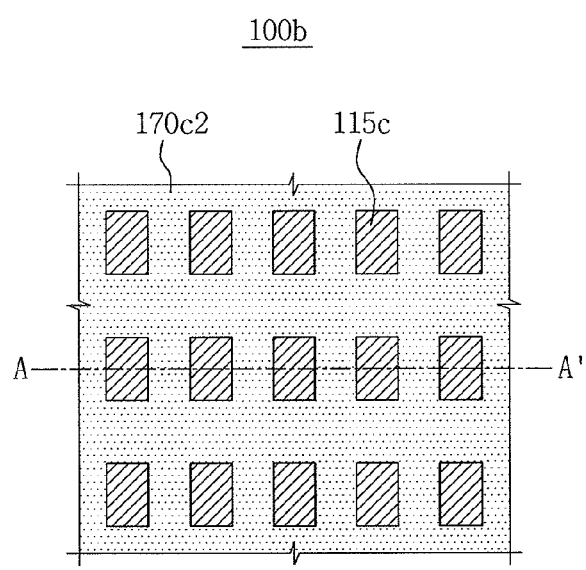

FIGS. 2A and 2B are a longitudinal cross-sectional view of a semiconductor device having a dual trench and a plan view of a cell region, respectively, in accordance with another exemplary embodiment according to the inventive concept. It will be appreciated that the view of the cell region C in FIG. 2A is taken along line A-A' of FIG. 2B. Referring to FIG. 2A, a semiconductor device 100b includes elements shown and described in FIG. 1. The cell region C further includes cell trenches 170c2 vertically extending into the semiconductor substrate 105, a first insulating material layer 110c directly formed on the semiconductor substrate 105, and a first conductive material layer 115c formed on the first insulating material layer 110c. The first insulating material layer 110c may be formed of an oxide layer, for example, a silicon oxide layer, an aluminum oxide layer, a hafnium oxide layer, or other oxide-based material layers. The first insulating material layer 110c may be used as a cell gate insulating layer. For example, in a non-volatile memory device technique such as a flash memory, etc., the first insulating material layer 110c may be used as a cell gate insulating layer, i.e., a tunnel insulating layer. The first conductive material layer 115c may be formed of silicon, metal silicide, metal, an alloy, a metal compound, or the like. The first conductive material layer 115c may be used as a cell gate electrode. In particular, in a flash memory device, the first conductive material layer 115c may be used as a floating gate electrode.

Referring to FIG. 2B, the first conductive material layer 115c is physically separated and/or electrically isolated by the cell trench region 170c2. In other words, the cell trench region 170c2 may vertically penetrate or pass through the first insulating materials and/or the first conductive material 115c. The first conductive material layer 115c is shown as an island shape when seen from a plan view, and may be disposed in a lattice pattern. While FIG. 2B illustrates the first conductive material layer 115c having a rectangular shape to facilitate understanding of the technical spirit of the inventive concept, the first conductive material layer 115c may have various shapes such as a circular, oval, polygonal shape, or the like, and is not limited to the rectangular shape. In addition, the first insulating material layer 110c may be physically separated and/or isolated by the vertically extended cell trench 170c2.

Figure 3:
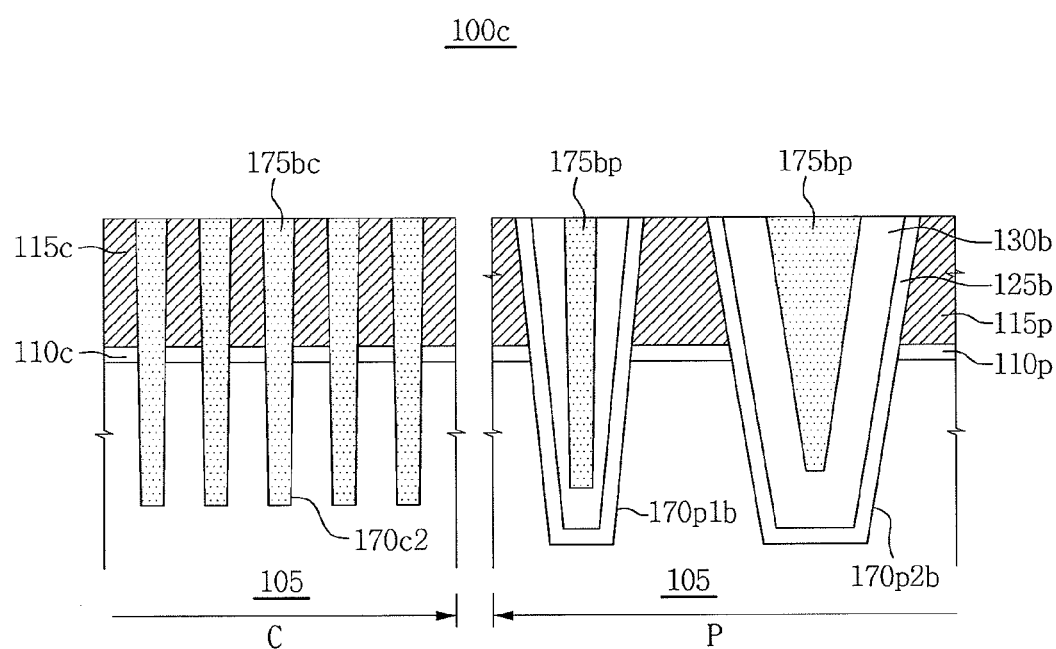
FIG. 3 is a schematic longitudinal cross-sectional view of a semiconductor device having a dual trench in accordance with still another exemplary embodiment.

FIG. 3 is a longitudinal cross-sectional view of a semiconductor device having a dual trench in accordance with still another exemplary embodiment according to the inventive concept. Referring to FIG. 3, a semiconductor device 100c includes elements shown and described in FIGS. 1 to 2B. The peripheral region P further includes peripheral trenches 170p1b and 170p2b vertically extending into the semiconductor substrate 105, a first insulating material layer 110p directly formed on the semiconductor substrate 105, and a first conductive material layer 115p formed on the first insulating material layer 110p. The first insulating material layer 110p and the first conductive material layer 115p may be physically separated and/or electrically isolated by the vertically extended peripheral trenches 170p1b and 170p2b. The first insulating material layer 110p may be used as a peripheral gate insulating layer of a transistor in the peripheral region P, in particular, as a peripheral gate insulating layer of a high-voltage transistor. The first insulating material layer 110c of the cell region C and the first insulating material layer 110p of the peripheral region P may be formed of the same material simultaneously. The first conductive material layer 115p may be used as a peripheral gate electrode of a transistor. The first conductive material layer 115p may be formed of the same material as the first conductive material layer 115c of the cell region C, and simultaneously formed therewith.

Figure 4A:
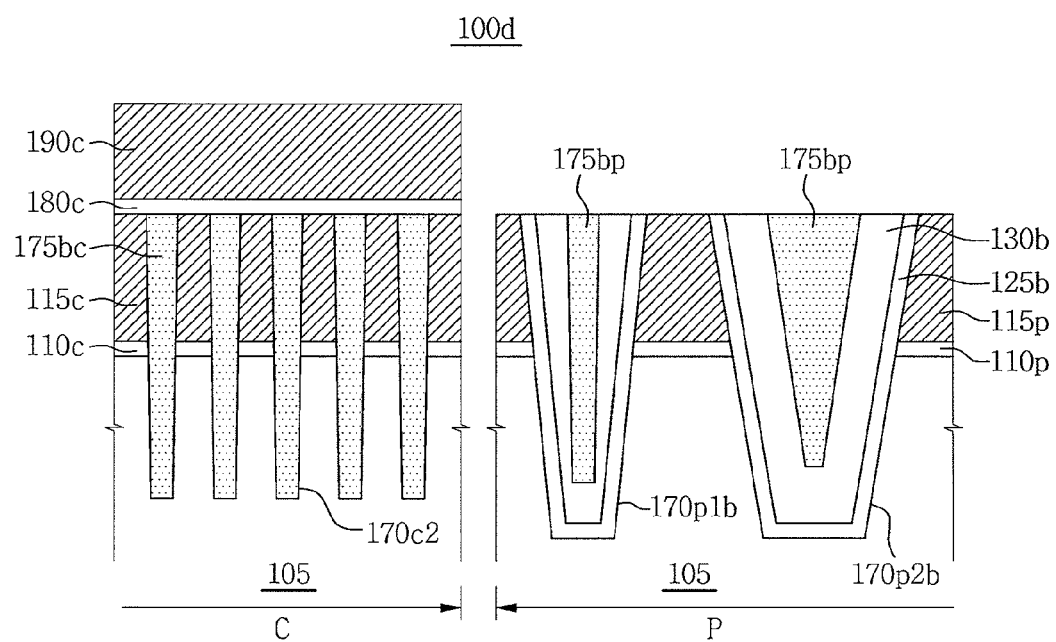
FIGS. 4A and 4B are a schematic longitudinal cross-sectional view of a semiconductor device having a dual trench and a schematic plan view of a cell region, respectively, in accordance with yet another exemplary embodiment.
Figure 4B:
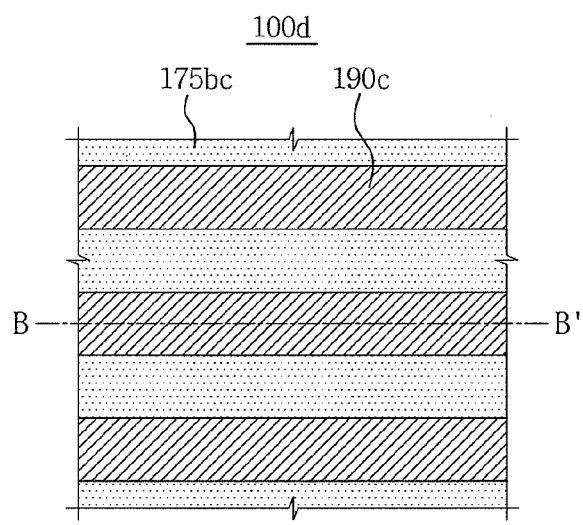

FIGS. 4A and 4B are a longitudinal cross-sectional view of a semiconductor device having a dual trench and a plan view of a cell region, respectively, in accordance with yet another exemplary embodiment according to the inventive concept. It will be appreciated that the view of the cell region C in FIG. 4A is taken along line B-B' of FIG. 4B. Referring to FIG. 4A, a semiconductor device 100d includes elements shown and described in FIGS. 1 to 3. The cell region C includes a second insulating material layer 180c directly faulted on the first conductive material layer 115c, and a second conductive material layer 190c formed on the second insulating material layer 180c. The second insulating material layer 180c may also be formed on upper surfaces of the cell trench regions 170c2. The second insulating material layer 180c may be formed of, for example, a silicon oxide layer, an aluminum oxide layer, a hafnium oxide layer, or other oxide-based material layers. The second insulating material layer 180c may be used as an inter-gate dielectric layer of a flash memory device. The second conductive material layer 190c may be formed of a conductive material, similar to the first conductive material layer 115c. However, there is no need to form the second conductive material layer 190c using the same material as the first conductive material layer 115c. The second conductive material layer 190c may be used as an electrode of a control gate in a flash memory device.

Referring to FIG. 4B, the second conductive material layer 190c may be formed in a plurality of parallel line shapes. In FIG. 4B, it is assumed that width of the first conductive material layer 115c is equal to width of the second conductive material layer 190c. This is an ideal example and simplified in order to be more apparently understood by those skilled in the art. It is also assumed that width of the second insulating material layer 180c is equal to width of the second conductive material layer 190c. That is, the second insulating material layer 180c can be formed under the second conductive material layer 190c only in the cell region C. Therefore, as described above, the second insulating material layer 180c may be formed on cell trenches 170c2 disposed between the first conductive material layers 115c in a major axis direction of the second conductive material layer 190c.

Figure 5:
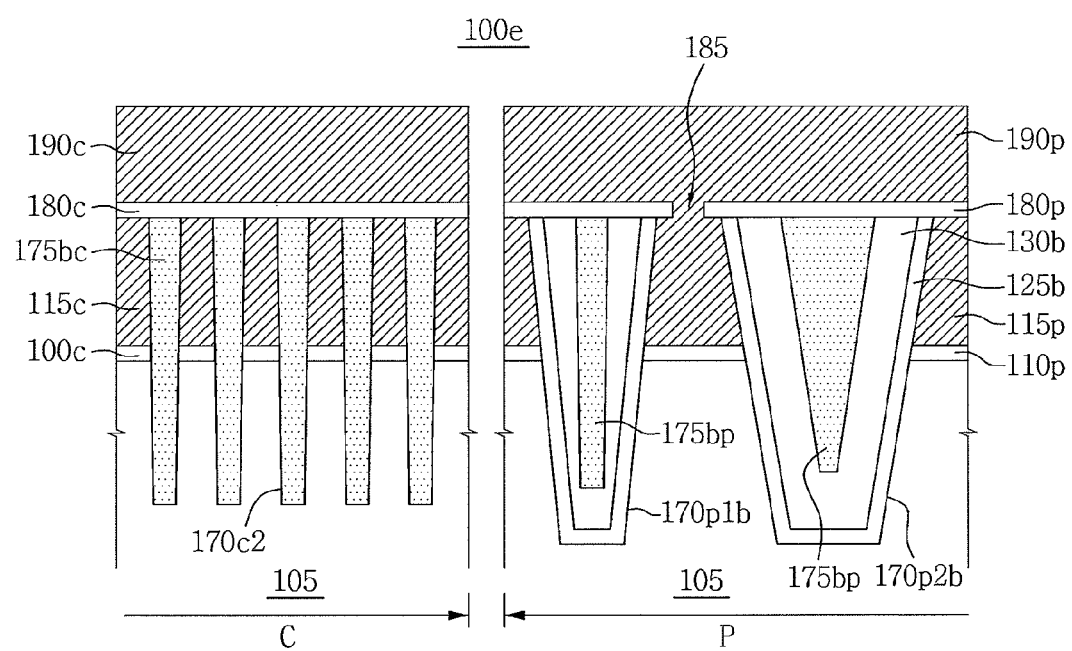
FIG. 5 is a schematic longitudinal cross-sectional view of a semiconductor device having a dual trench in accordance with yet another exemplary embodiment.

FIG. 5 is a longitudinal cross-sectional view of a semiconductor device having a dual trench in accordance with yet another exemplary embodiment according to the inventive concept. Referring to FIG. 5, a semiconductor device 100e includes elements shown and described in FIGS. 1 to 4B. The peripheral region P includes a second insulating material layer 180p formed on the first conductive material layer 115p and the peripheral trenches 170p1b and 170p2b, and a second conductive material layer 190p formed on the second insulating material layer 180p. The second insulating material layer 180p may include an opening 185. The first conductive material layer 115p and the second conductive material layer 190p may be physically or electrically connected to each other by the opening 185. The second insulating material layer 180p may be simultaneously formed with the second insulating material layer 180c. The second conductive material layer 190p may be an element of the second conductive material layer 190c that extends into the peripheral region P, or may be a peripheral gate electrode of a separate CMOS transistor. The second conductive material layer 190p may be simultaneously formed with the second conductive material layer 190c. In addition, since the first conductive material layer 115p and the second conductive material layer 190p are not completely and necessarily physically separated and/or electrically isolated in the peripheral region P, the opening 185 may be formed at various positions in various shapes. For example, the opening 185 may be formed to expose some surfaces of the peripheral trenches 170p1b and 170p2b.

Figure 6A:
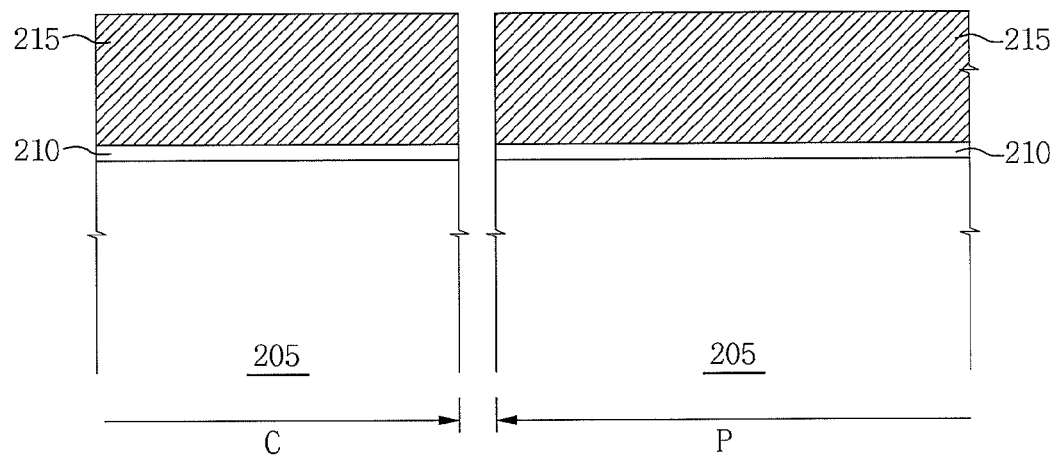
FIGS. 6A to 6R are schematic longitudinal cross-sectional views illustrating a method of fabricating a semiconductor device having a dual trench in accordance with an exemplary embodiment.

Methods of forming semiconductor devices in accordance with various exemplary embodiments according to the inventive concept will now be described with respect to the whole processes. FIGS. 6A to 6R are longitudinal cross-sectional views illustrating a method of fabricating a semiconductor device having a dual trench in accordance with an exemplary embodiment according to the inventive concept. Referring to FIG. 6A, a first insulating material layer 210 and a first conductive material layer 215 are formed on a semiconductor substrate 205 having a cell region C and a peripheral region P. The first insulating material layer 210 may be formed of a silicon oxide layer, an aluminum oxide layer, a hafnium oxide layer, or other oxide-based material layers using a silicon oxidation method, chemical vapor deposition (CVD), atomic layer deposition (ALD), etc. The first conductive material layer 215 may be formed of silicon, metal silicide, metal, an alloy or a metal compound, etc., through physical vapor deposition (PVD), CVD, ALD, or the like.

Figure 6B:
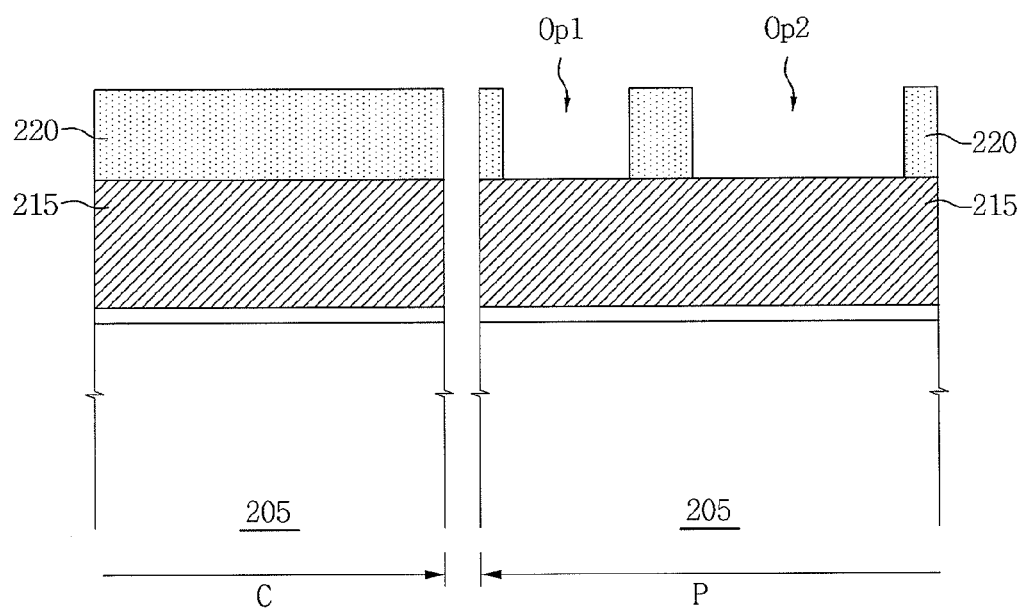

Referring to FIG. 6B, a first patterning mask pattern 220 is formed on the first conductive material layer 215. The first patterning mask pattern 220 may include openings Op1 and Op2 selectively exposing the surface of the first conductive material layer 215 in the peripheral region P. The first patterning mask pattern 220 may be formed as a soft mask formed of an organic material such as photoresist, etc., or a hard mask formed of an inorganic material such as silicon nitride, silicon oxy-nitride, etc.

Figure 6C:
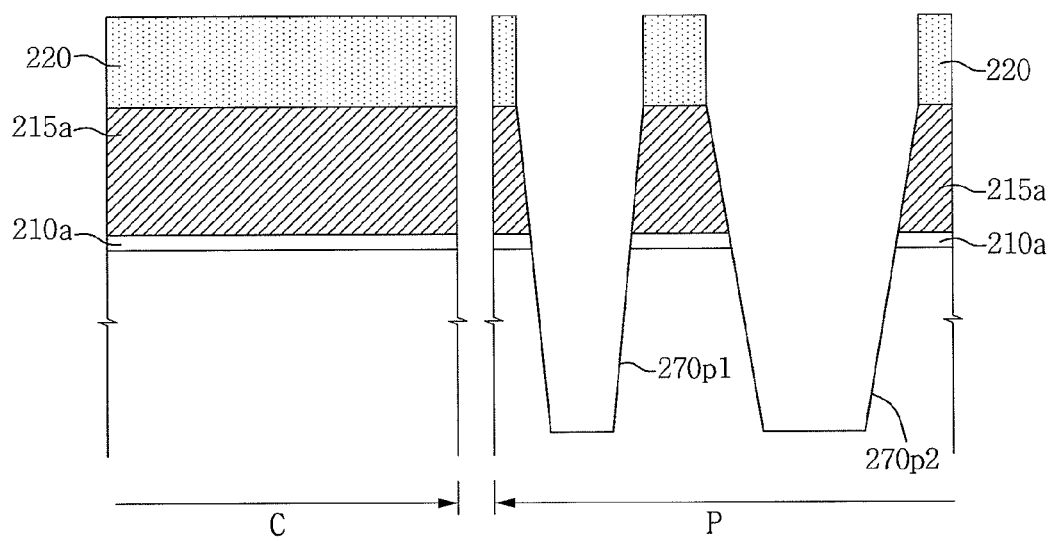

Referring to FIG. 6C, the first conductive material layer 215p, the first insulating material layer 210p and the semiconductor substrate 205 in the peripheral region P are patterned using the first patterning mask pattern 220 to form a first insulating material layer pattern 210a, a first conductive material layer pattern 215a and peripheral trenches 270p1 and 270p2. The peripheral trenches 270p1 and 270p2 are empty. The peripheral trenches 270p1 and 270p2 may have the same size or different various sizes. In order to generally describe the technical spirit of the inventive concept, the peripheral trenches 270p1 and 270p2 in this drawing are shown to have different sizes.

Figure 6D:
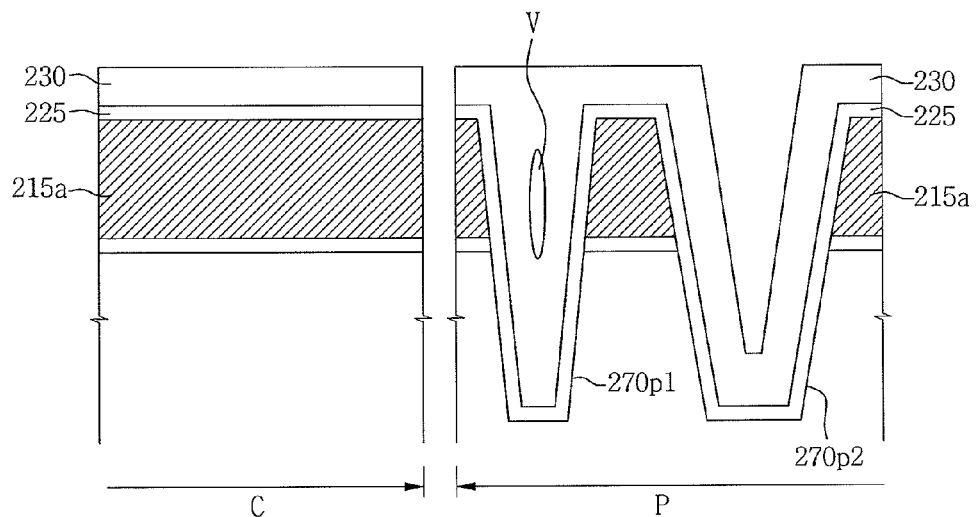

Referring to FIG. 6D, the first patterning mask pattern 220 is removed, and a lining insulating material layer 225 and a padding insulating material layer 230 are formed on the upper surface of the first conductive material pattern 215a and in the peripheral trenches 270p1 and 270p2. The lining insulating material layer 225 may be conformably formed of silicon oxide or silicon nitride. The lining insulating material layer 225 may be formed by oxidizing the surface of the first conductive material layer pattern 215a and the surface of the semiconductor substrate 205 exposed by the peripheral trenches 270p1 and 270p2. In particular, the lining insulating material layer 225 may be formed by oxidizing the surface of the semiconductor substrate 205 at a temperature of about 500° C. to 900° C. That is, the lining insulating material layer 225 may be a thermal oxide layer. The lining insulating material layer 225 may cover the surface of the first conductive material layer pattern 215a in the cell region C, and may be formed on the surface and sidewalls of the first conductive material layer pattern 215a, the exposed side surfaces of the first insulating material layer 210a, and the exposed surface of the semiconductor substrate 205 in the peripheral region P. The padding insulating material layer 230 may be conformably formed of silicon oxide, in particular, a silicate-based oxide material, specifically, undoped silicate glass (USG). The padding insulating material layer 230 may be formed by CVD. The padding insulating material layer 230 may be formed on the lining insulating material layer 225 in the cell region C, and may be formed on the lining insulating material layer 225 to entirely or partially fill the interior of the peripheral trenches 270p1 and 270p2 in the peripheral region P. Here, in a relatively small peripheral trench of the peripheral trenches 270p1 and 270p2, a void V may occur during the process of forming the padding insulating material layer 230. The reason for showing and describing the void V is that occurrence of the void does not affect implementation of the technical spirit of the inventive concept. That is, according to the inventive concept, occurrence of the void V does not adversely affect the technical spirit of the inventive concept.

Figure 6E:
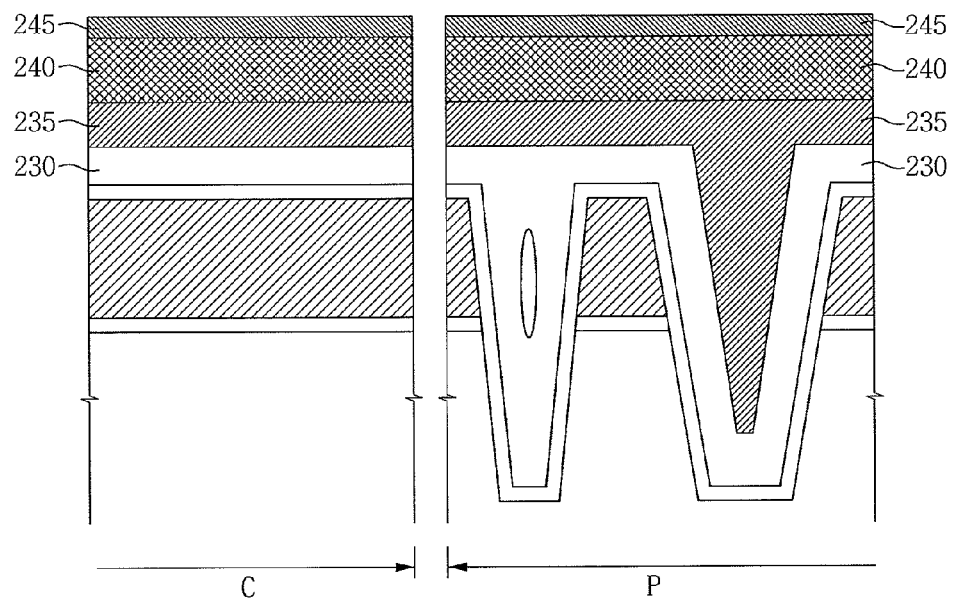

Referring to FIG. 6E, a first intermediate material layer 235, a second intermediate material layer 240, and a third intermediate material layer 245 are formed on the padding insulating material layer 230. The first intermediate material layer 235 may be formed of a material having an etch selectivity with respect to the padding insulating material layer 230, for example, silicon. The second intermediate material layer 240 may be formed of a material having an etch selectivity with respect to the first intermediate material layer 235. In addition, the second intermediate material layer 240 may be formed of a material having an etch selectivity with respect to silicon or an oxide-based material, for example, an organic material. In particular, the second intermediate material layer 240 may include organic materials for example, a resin such as photoresist, or carbon-containing materials, e.g. SOH. The third intermediate material layer 245 may be formed of a material having an etch selectivity with respect to the second intermediate material layer 240. The third intermediate material layer 245 may have a function of capping the second intermediate material layer 240. Here, the capping function means that a layer of a hard material is formed on a lower layer formed of a soft material to fix the lower layer. In addition, the third intermediate material layer 245 may function as an anti-reflective layer. The third intermediate material layer 245 may be formed of silicon oxy-nitride (SiON) or silicon nitride (SiN). When the third intermediate material layer 245 is formed of an organic material, the second intermediate material layer 240 may be formed of an inorganic material. The second intermediate material layer 240 and the third intermediate material layer 245 may be formed of a combination of an organic material and an inorganic material for better results.

Figure 6F:
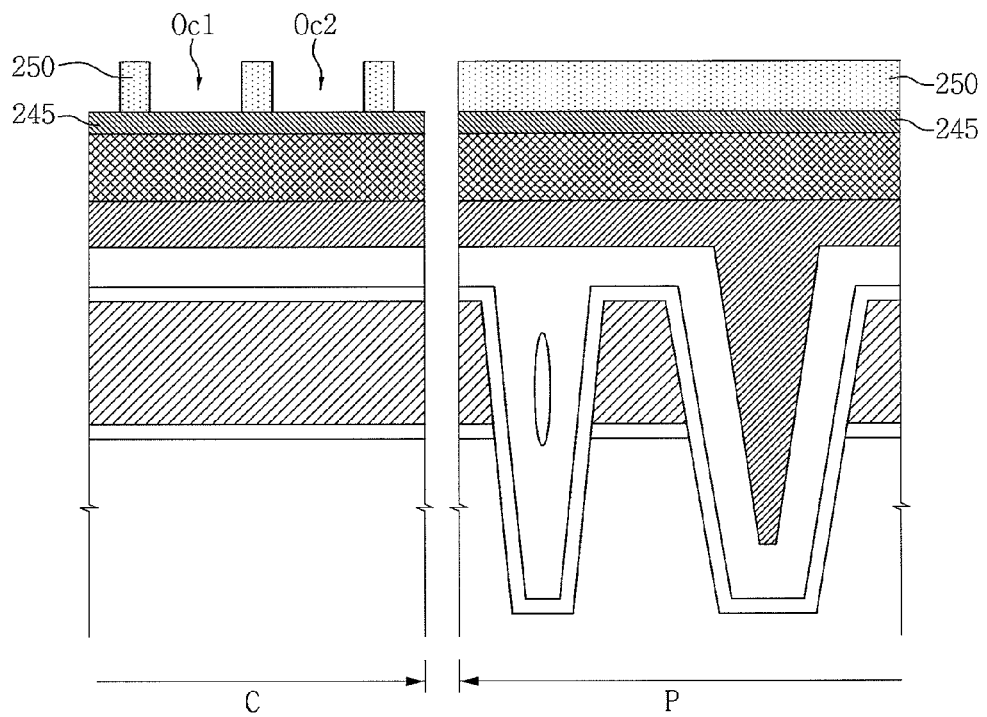

Referring to FIG. 6F, a second patterning mask pattern 250 is formed on the third intermediate material layer 245. The second patterning mask pattern 250 may include opening patterns Oc1 and Oc2 for selectively exposing the surface of the third intermediate material layer 245 of the cell region C. The second patterning mask pattern 250 may also be formed of an organic material-based soft mask such as photoresist, etc., or an inorganic material-based hard mask.

Figure 6G:
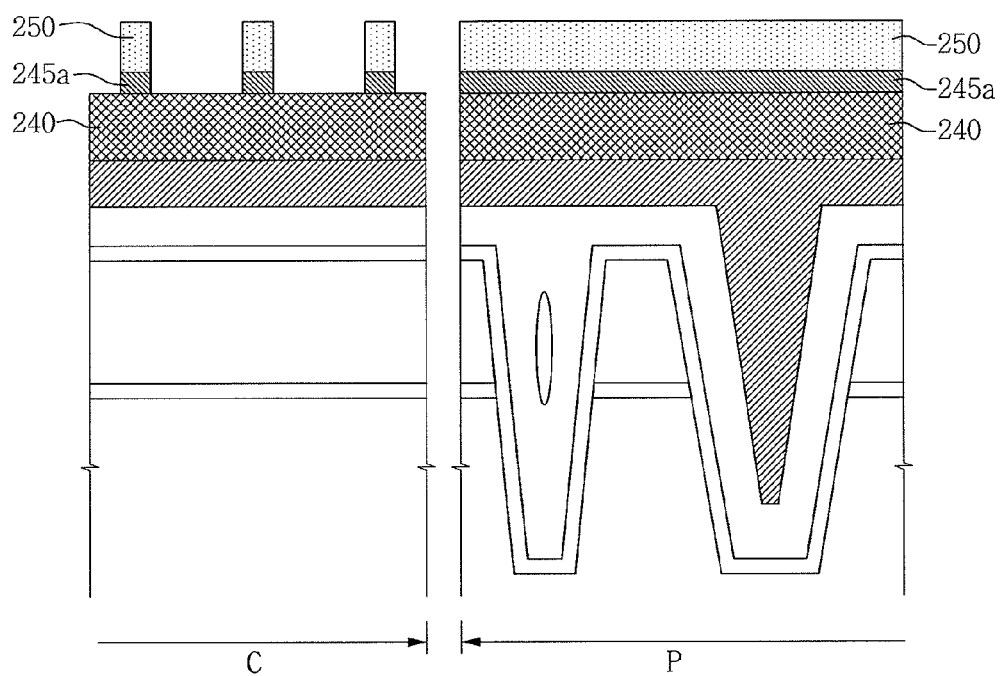

Referring to FIG. 6G, the third intermediate material layer 245 of the cell region C is patterned using the second patterning mask pattern 250 to form a third intermediate material layer pattern 245a for selectively exposing the surface of the second intermediate material layer 240.

Figure 6H:
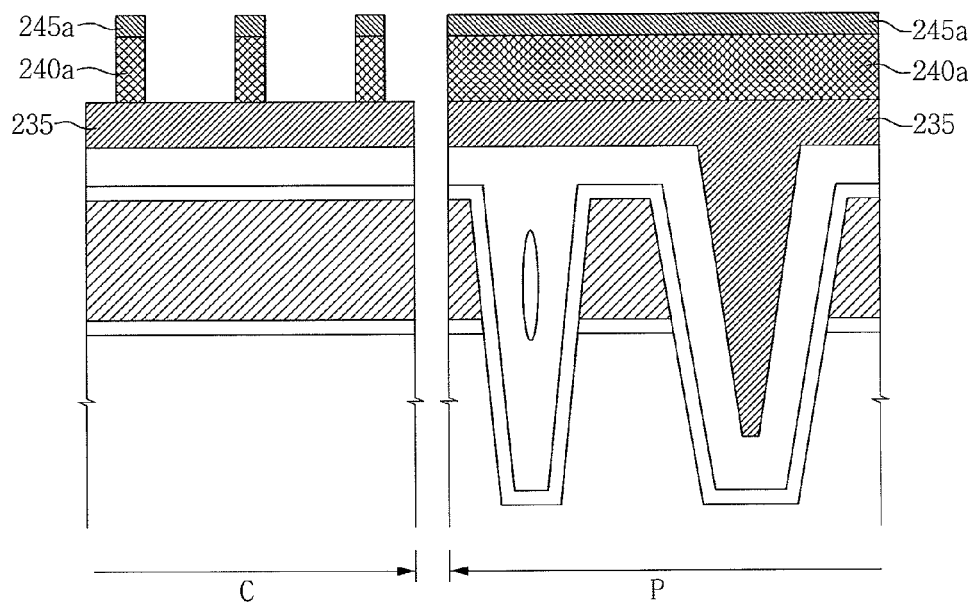

Referring to FIG. 6H, the second patterning mask pattern 250 is removed, and the second intermediate material layer 240 of the cell region C is patterned using the third intermediate material layer pattern 245 to form a second intermediate material layer pattern 240a for selectively exposing the surface of the first intermediate material layer 235. The process of removing the second patterning mask pattern 250 and the process of patterning the second intermediate material layer 240 may be processes using oxygen plasma. That is, the process of removing the second patterning mask pattern 250 and the process of patterning the second intermediate material layer 240 may be simultaneously or continuously performed.

Figure 6I:
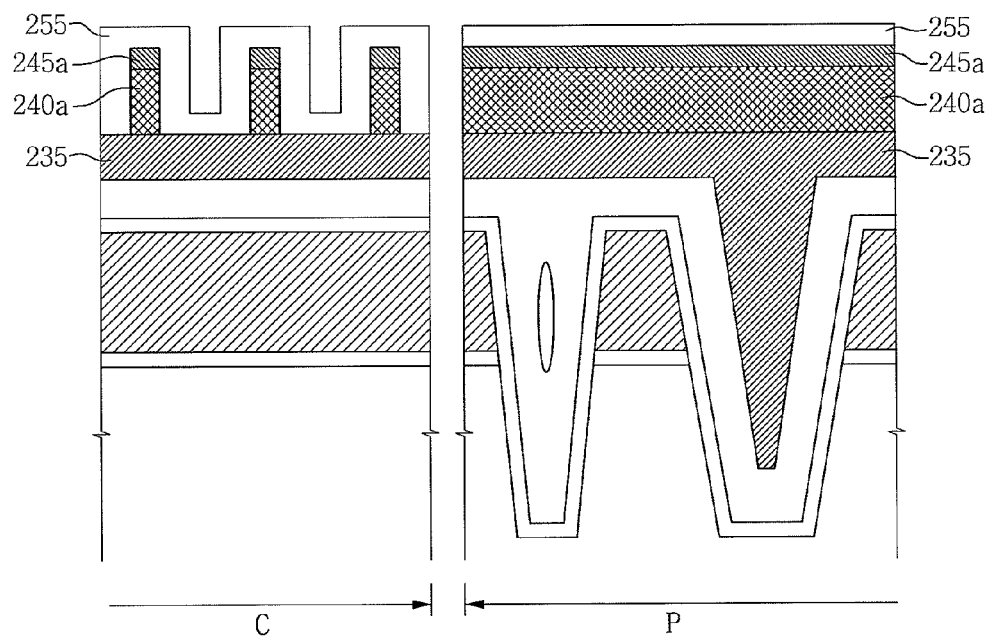

Referring to FIG. 6I, a spacer material layer 255 covering the exposed surface of the first intermediate material layer 235, the second intermediate material layer pattern 240a and the third intermediate material layer pattern 245a is formed. The spacer material layer 255 may be formed of silicon oxide. The spacer material layer 255 may be formed to have thicknesses and spaces equal or similar to each other in a horizontal direction. This is because a double patterning technique capable of improving patterning resolution by two times can be realized.

Figure 6J:
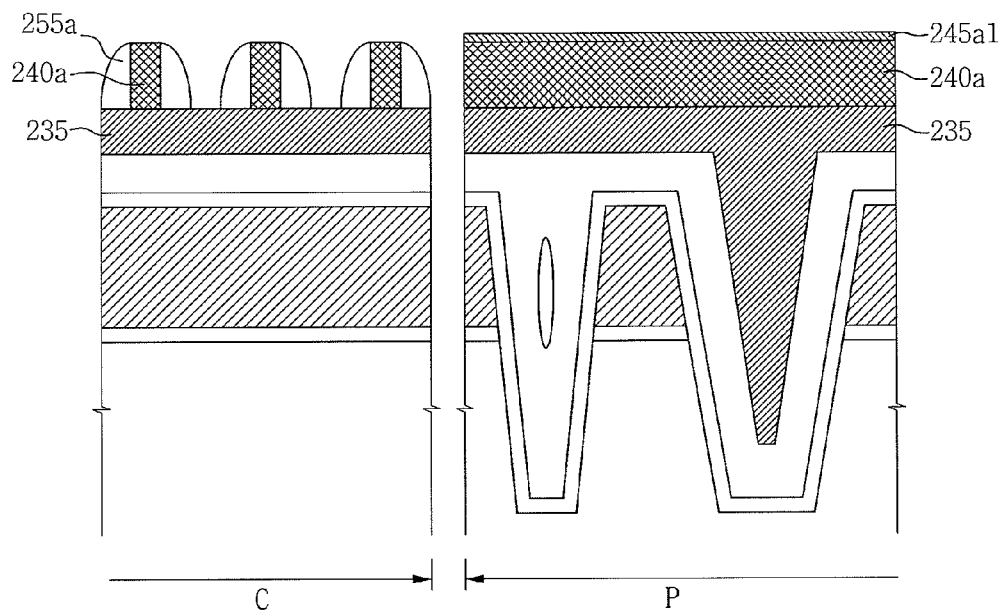

Referring to FIG. 6J, the spacer material layer 255 is patterned to form a spacer pattern 255a. The spacer pattern 255a may be formed by an etch-back process. The spacer pattern 255a may be formed in a spacer shape. In this process, the third intermediate material layer pattern 245a of the cell region C may be mostly or entirely removed. Here, the third intermediate material layer pattern 245a of the peripheral region P may be completely removed to remain as a third intermediate material layer pattern 245a1. This may be affected by a loading effect. This process may be affected by process conditions such as a concentration of a patterning reactor and/or a pattern density of the third intermediate material layer pattern 245a. That is, the thickness of the remaining thinned third intermediate material layer pattern 245a1 may be adjusted according to process conditions, etc.

Figure 6K:
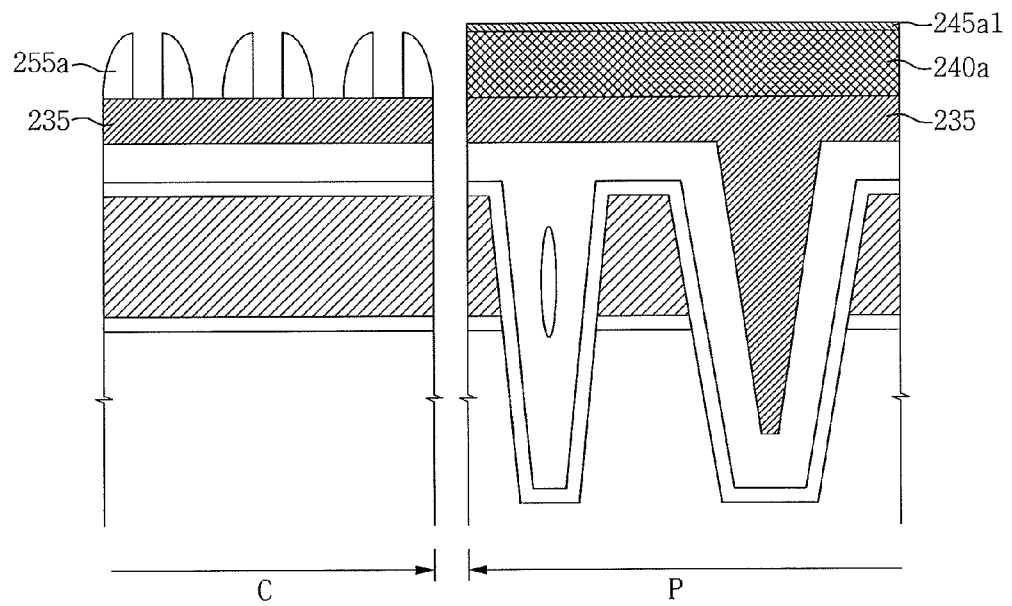

Referring to FIG. 6K, the second intermediate material layer pattern 240a exposed between the spacer patterns 255a is removed to expose the first intermediate material layer 230.

Figure 6L:
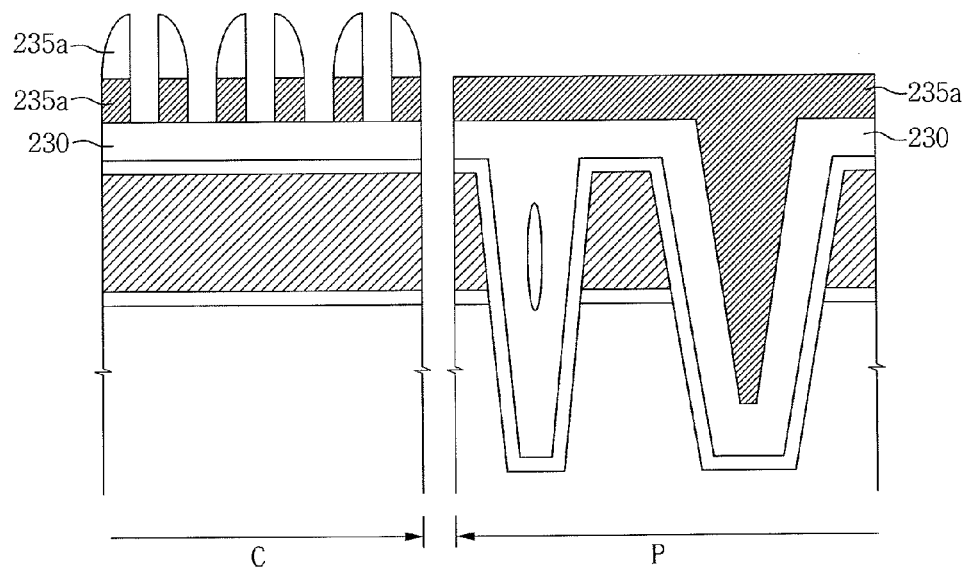

Referring to FIG. 6L, the first intermediate material layer 235 is patterned using the spacer pattern 255a as a patterning mask to farm a first intermediate material layer pattern 235a for exposing the surface of the padding insulating material layer 230. In the peripheral region P, the remaining thinned third material layer pattern 245a1 and the second material layer pattern 240a are completely removed to entirely expose the first intermediate material layer pattern 235a.

Figure 6M:
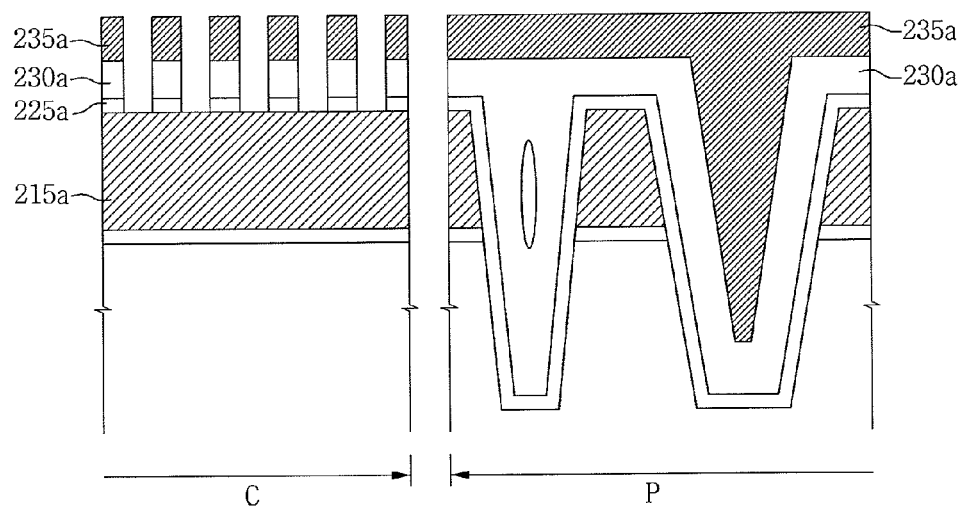

Referring to FIG. 6M, the padding insulating material layer 230 and the lining insulating material layer 225 of the cell region C are patterned using the first intermediate material layer pattern 235a as a patterning mask to form a padding insulating material layer pattern 230a and a lining insulating material layer pattern 225a for selectively exposing the surface of the first conductive material layer pattern 215a. The spacer pattern 255a is primarily removed. When the respective material layers are set such that the spacer pattern 255a, the padding insulating material layer 230 and the lining insulating material layer 225 are removed by the same etching material, the three material layers may be simultaneously patterned or removed by only one patterning process.

Figure 6N:
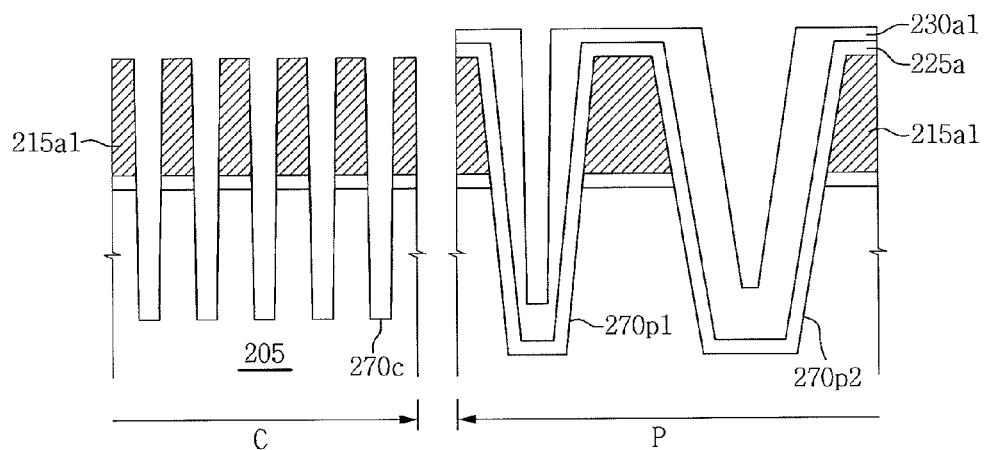

Referring to FIG. 6N, the first conductive material layer pattern 215a, the first insulating material layer pattern 210a and the semiconductor substrate 205 are patterned using the padding insulating material layer pattern 230a and the lining insulating material layer pattern 225 of the cell region C as an etch mask to form cell trenches 270c. Simultaneously, the first intermediate material layer pattern 235a, the padding insulating material layer pattern 230a and the lining insulating material layer pattern 225a of the cell region C may be removed. In the peripheral region P, the first intermediate material layer pattern 235a is removed and a surface thickness of the padding insulating material layer pattern 230a may be thinned. In addition, the void V existing in the relatively small peripheral trench 270p1 of the peripheral region P may be removed.

Figure 6O:
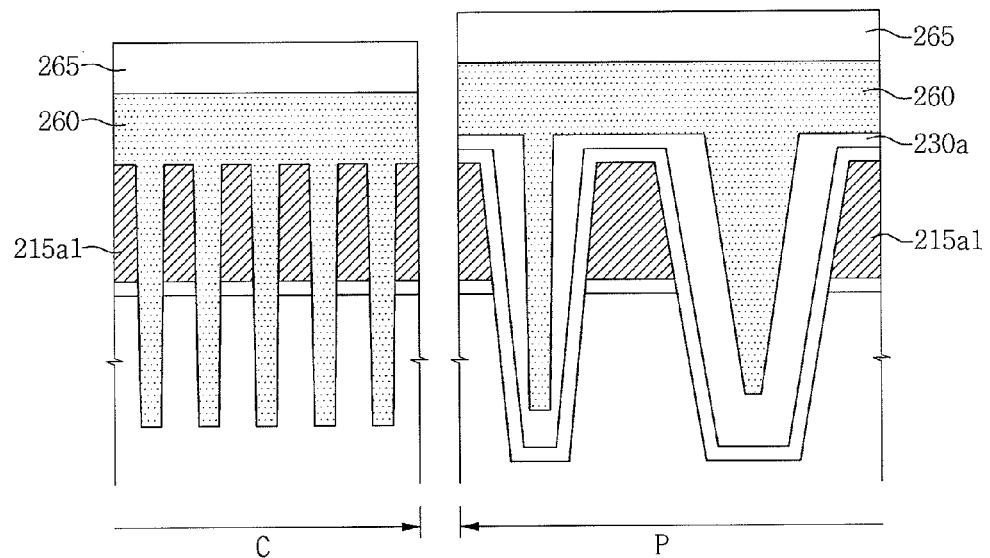

Referring to FIG. 6O, a core insulating material layer 260 is formed on the entire surface of the cell region C and the peripheral region P. The core insulating material layer 260 may be formed of a material having good fluidity and gap-fill characteristics. The core insulating material layer 260 may have a better etching resistance than the padding insulating material layer 230. The core insulating material layer 260 may be formed through a coating method. The core insulating material layer 260 may be formed of a silazene-based material, specifically, tonen silazene (TOSZ). Etching resistance means resistance against reactive materials for patterning oxide-based materials. The reactive materials may include a material containing fluorine, for example, HF, CxFy, CxHyFz, SxFy, WxFy, etc. In addition, an upper insulating material layer 265 may be further formed on the core insulating material layer 260. The upper insulating material layer 265 may be formed of a harder material then the core insulating material layer 260. The upper insulating material layer 265 can fix the core insulating material layer 265 or improve stability of a planarization process such as CMP, etc., which will be described. For example, the upper insulating material layer 265 may be formed of high-density plasma (HDP) oxide. While FIG. 6O illustrates the core insulating material layer 260 and the upper insulating material layer 265 having different surface heights in the cell regions C and the peripheral regions P, since a material having good fluidity also has good planarization characteristics, there may be no difference in height of the surfaces. On the contrary, the surface heights may have a large difference.

Figure 6P:
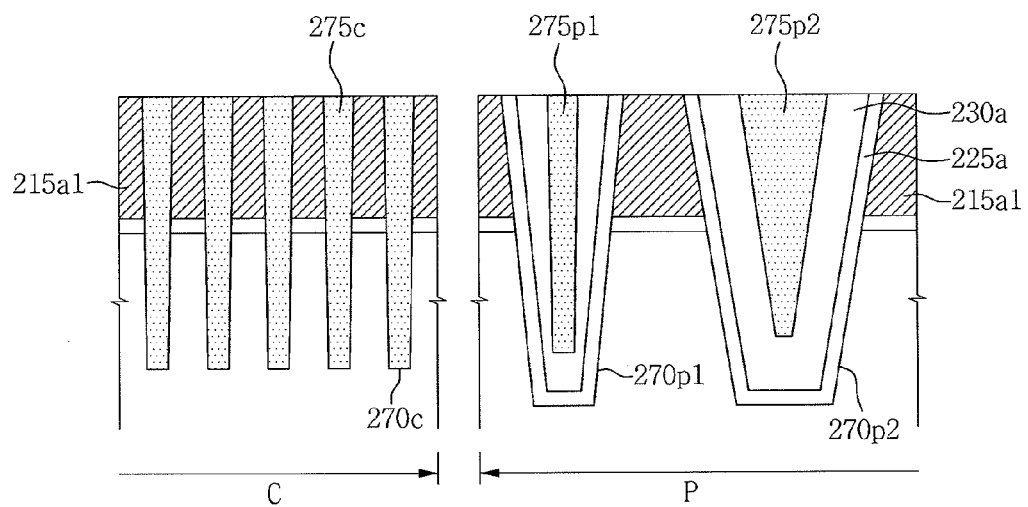

Referring to FIG. 6P, a planarization process is performed to form a cell filling insulating material 275c and peripheral filling insulating materials 275p1 and 275p2 filled in the cell trenches 270c and the peripheral trenches 270p1 and 270p2. The planarization process may be a CMP process. An upper surface of the first conductive material layer pattern 215a1, and upper surfaces of the padding insulating material layer 230a and the lining insulating material layer pattern 225a may be exposed.

Figure 6Q:
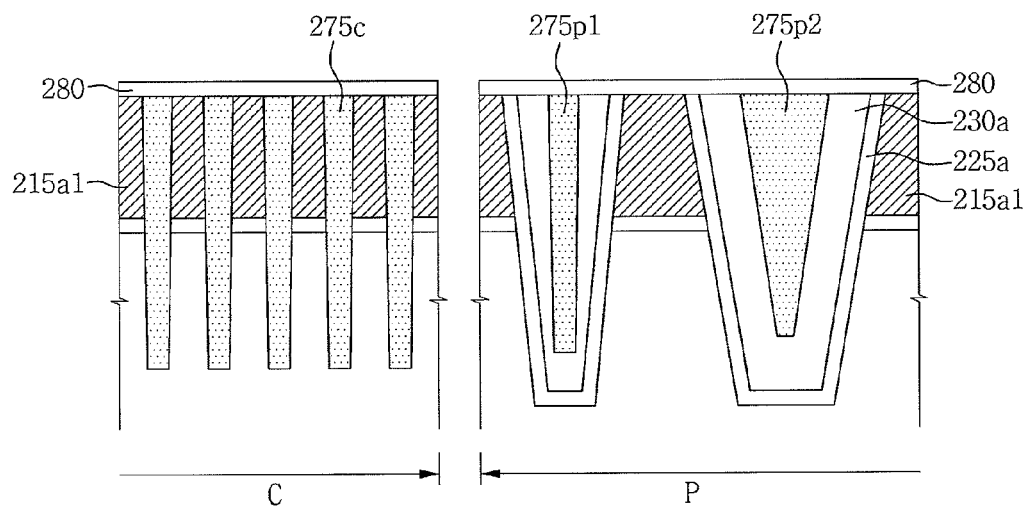
Figure 6R:
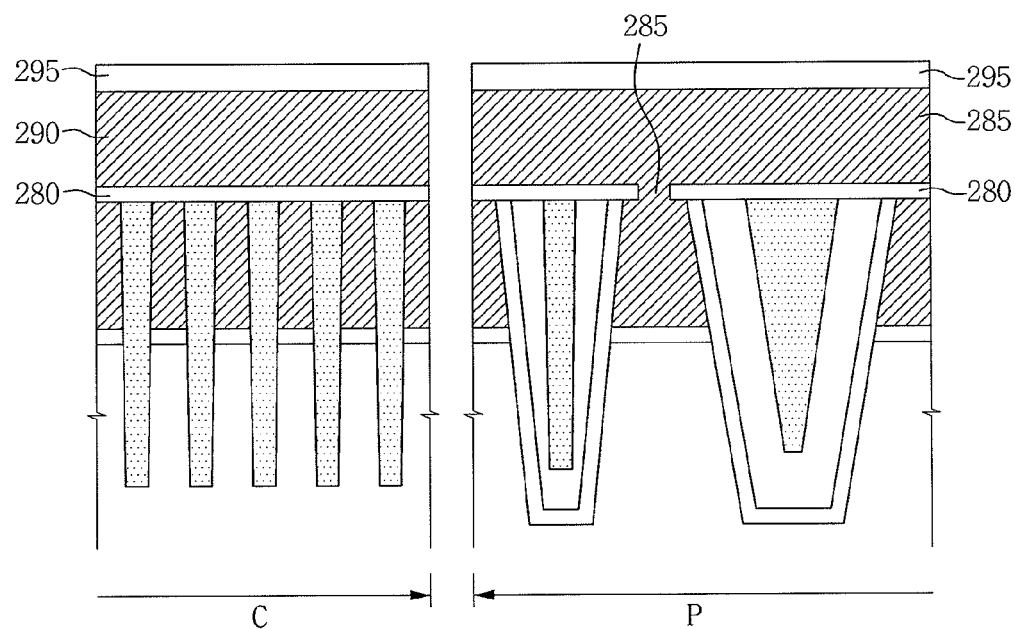

Referring to FIG. 6Q, a second insulating material layer 280 is formed on the filling insulating materials 275c, 275p1 and 275p2, the upper surface of the first conductive material layer pattern 215a, the padding insulating material layer pattern 230a and the lining insulating material layer pattern 225a. The second insulating material layer 280 may be fanned by CVD or ALD. The second insulating material layer 280 may be formed of a silicon oxide layer, an aluminum oxide layer, a hafnium oxide layer, or other oxide-based material layers.

Referring to FIG. 6R, an opening 285 selectively exposing the first conductive material layer pattern 215a1 is formed in the second insulating material layer 280 of the peripheral region P, and a second conductive material layer 290 is formed. The first conductive material layer pattern 215a1 may be physically and/or electrically connected to the second conductive material layer 290 via the opening 285. Next, a capping insulating layer 295 is formed on the second conductive material layer 290 so that the subsequent semiconductor device manufacturing processes can be performed. The second conductive material layer may be formed of silicon oxide, silicon nitride, or silicon oxy-nitride.

As described above, the methods of implementing semiconductor devices of the exemplary embodiments have been described. It will be readily apparent to those skilled in the art that various structures illustrated in FIGS. 1 to 5 can be realized through the above description.

Figure 7A:
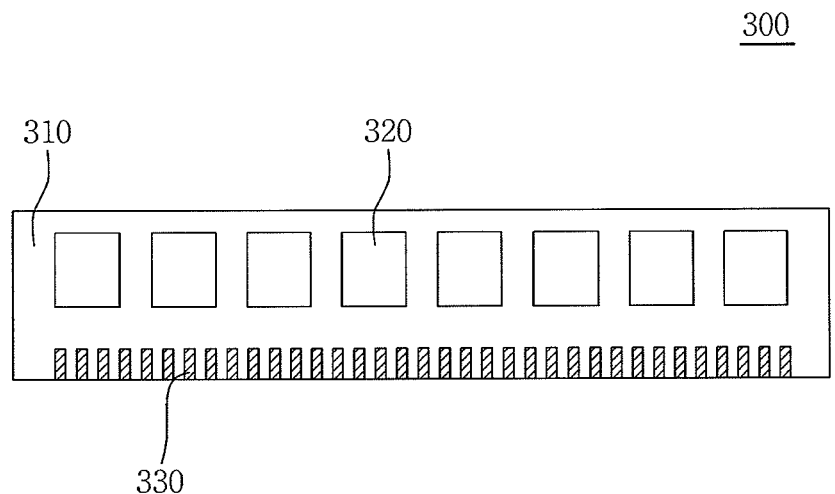
FIGS. 7A to 7C are schematic views of a semiconductor module, an electronic circuit board, and an electronic system, respectively, including a semiconductor device in accordance with exemplary embodiments.

FIG. 7A is a schematic view of a semiconductor module including a semiconductor device in accordance with an exemplary embodiment. Referring to FIG. 7A, a semiconductor module 300, in which semiconductor devices in accordance with any of the exemplary embodiments described herein is mounted, includes a module substrate 310, a plurality of semiconductor devices 320 disposed on the module substrate 310, and module contact terminals 330 formed in parallel on one edge of the module substrate 310 and electrically connected to the semiconductor devices 320. The module substrate 310 may be a printed circuit board (PCB). Both surfaces of the module substrate 310 may be used. That is, the semiconductor devices 320 may be disposed on front and rear surfaces of the module substrate 310. While FIG. 7A illustrates the semiconductor devices 320 disposed on the front surface of the module substrate 310, it has been shown for an illustrative purpose only. In addition, a separate semiconductor device may be further provided to control semiconductor devices or semiconductor packages. Therefore, the number of semiconductor devices 310 shown in FIG. 7A is not necessarily provided to a single semiconductor module 300. At least one of the semiconductor devices 320 may include a semiconductor device structure in accordance with an exemplary embodiment. The module contact terminals 330 may be foamed of a metal and have oxidation resistance. The module contact terminals 330 may be variously set according to standards. For this reason, the number of the module contact terminals 330 can be different than that shown in FIG. 7A.

Figure 7B:
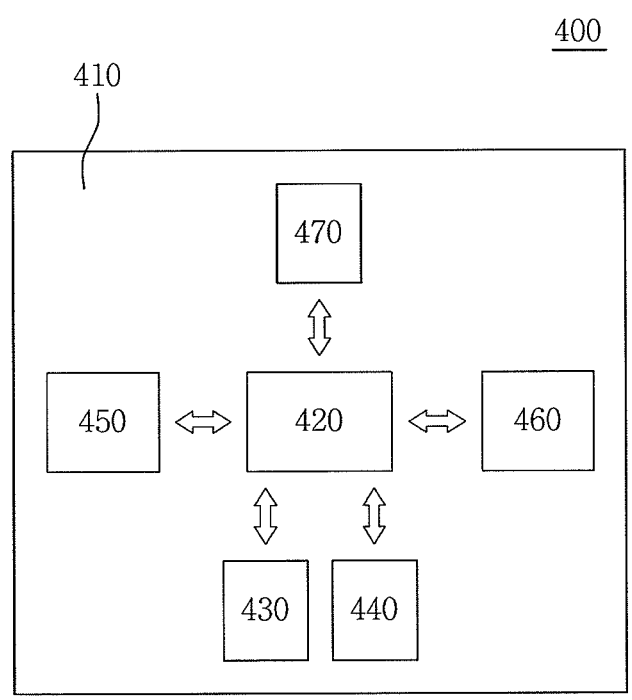

FIG. 7B is a block diagram of an electronic circuit board including a semiconductor device in accordance with any of the exemplary embodiments described herein. Referring to FIG. 7B, an electronic circuit board 400 in accordance with an exemplary embodiment includes a microprocessor 420 disposed on a circuit board 410, a main storage circuit 430 and a supplementary storage circuit 440 in communication with the microprocessor 420, an input signal processing circuit 450 for sending a command to the microprocessor 420, an output signal processing circuit 460 for receiving a command from the microprocessor 420, and a communicating signal processing circuit 470 for sending/receiving an electric signal to/from another circuit board. Arrows can be understood to show paths to transmit electric signals. The microprocessor 420 can receive and process various electric signals, output the processed results, and control other components of the electronic circuit board 410. The microprocessor 420 may be, for example, a central processing unit (CPU) and/or a main control unit (MCU). The main storage circuit 430 can temporarily store data that is frequently required by the microprocessor 420 or data before and after processing. Since the main storage circuit 430 needs a rapid response speed, the main storage circuit 430 may be constituted by a semiconductor memory. More specifically, the main storage circuit 430 may be a semiconductor memory, such as a cache memory, or may be constituted by a static random access memory (SRAM), a dynamic random access memory (DRAM), a resistive random access memory (RRAM), and their applied semiconductor memories, for example, a utilized RAM, a ferro-electric RAM, a fast cycle RAM, a phase changeable RAM; and other semiconductor memories. In addition, the main storage circuit 430 may include a volatile or non-volatile random access memory. In this embodiment, the main storage circuit 430 may include at least one semiconductor device in accordance with any of the exemplary embodiments described herein or at least one semiconductor module including the semiconductor device. The supplementary storage circuit 440 may be a large capacity storage device, which may be a non-volatile semiconductor memory such as a flash memory, a hard disc drive using a magnetic field, or a compact disc drive using light. The supplementary storage circuit 440 may be used when a large amount of data is to be stored, not requiring a rapid response speed. The supplementary storage circuit 440 may include a random or non-random access non-volatile storage device. The supplementary storage circuit 440 may include at least one semiconductor device in accordance with any of the exemplary embodiments described herein or a semiconductor module 300 including the semiconductor device. The input signal processing circuit 450 may convert an external command into an electric signal, or transmit the electric signal transmitted from the exterior to the microprocessor 420. The command transmitted from the exterior or the electric signal may be an operation command, an electric signal to be processed, or data to be stored. The input signal processing circuit 450 may be a terminal signal processing circuit for processing a signal transmitted from, for example, a keyboard, a mouse, a touch pad, an image recognition device or various sensors, an image signal processing circuit for processing an image signal input from a scanner or a camera, or various sensors or input signal interfaces. The input signal processing circuit 450 may include at least one semiconductor device in accordance with any of the exemplary embodiments described herein, or at least one semiconductor module 300 including the semiconductor device. The output signal processing circuit 460 may be a component for transmitting an electric signal processed through the microprocessor 420 to the exterior. For example, the output signal processing circuit 460 may be a graphics card, an image processor, an optical converter, a beam panel card, interface circuits having various functions, or the like. The output signal processing circuit 460 may include at least one semiconductor device in accordance with any of the exemplary embodiments described herein, or at least one semiconductor module 300 including the semiconductor device. The communication circuit 470 is a component for directly sending/receiving an electric signal to/from another electronic system or another circuit board, not through the input signal processing circuit 450 or the output signal processing circuit 460. For example, the communication circuit 470 may be a modem, a LAN card, or various interface circuits of a personal computer system. The communication circuit 470 may include a semiconductor device in accordance with any of the exemplary embodiments described herein, or at least one semiconductor module 300 including the semiconductor device.

Figure 7C:
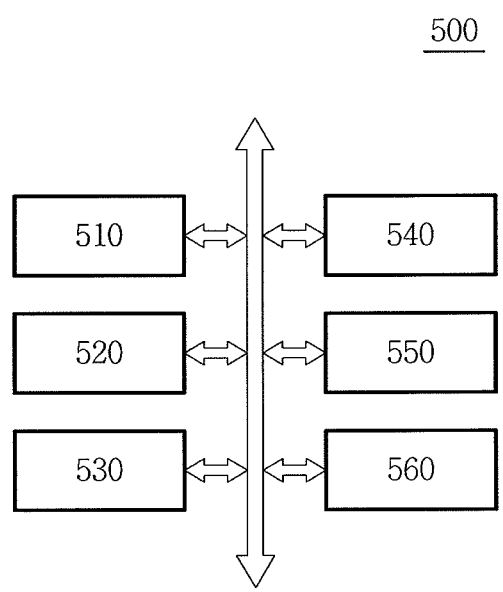

FIG. 7C is a block diagram of an electronic system including a semiconductor device or a semiconductor module including the semiconductor device in accordance with any of the exemplary embodiments described herein. Referring to FIG. 7C, an electronic system in accordance with an exemplary embodiment includes a control unit 510, an input unit 520, an output unit 530, and a storage unit 540, and may further include a communication unit 550 and an operation unit 560. The control unit 510 can generally control the electronic system 500 and the other units of the system 500. The control unit 510 may be a central processing unit or a central control unit, and may include the electronic circuit board 400 in accordance with an exemplary embodiment. In addition, the control unit 510 may include a semiconductor device in accordance with the inventive concept or at least one semiconductor module 300 including the semiconductor device. The input unit 520 can send an electric command signal to the control unit 510. The input unit 520 may be a keyboard, a key pad, a mouse, a touch pad, an image recognition device such as a scanner, or various input sensors. The input unit 520 may include a semiconductor device in accordance with any of the exemplary embodiments described herein or at least one semiconductor module 300 including the semiconductor device. The output unit 530 can receive an electric command signal from the control unit 510 and output the results processed by the electronic system 500. The output unit 530 may be a monitor, a printer, a beam projector, or various mechanical devices. The output unit 530 may include a semiconductor device in accordance with any of the exemplary embodiments described herein or at least one semiconductor module 300 including the semiconductor device. The storage unit 540 may be a component for temporarily or permanently storing an electric signal to be processed or already processed by the controller 510. The storage unit 540 may be physically or electrically connected or coupled to the control unit 510. The storage unit 540 may be a semiconductor memory, a magnetic storage device such as a hard disc, an optical storage device such as a semiconductor memory, or other servers having data storage functions. In addition, the storage unit 540 may include a semiconductor device in accordance with any of the exemplary embodiments described herein or at least one semiconductor module 300 including the semiconductor device. The communication unit 550 can receive an electric command signal from the control unit 510 and send/receive an electric signal to/from another electronic system. The communication unit 550 may be a wired sending/receiving device such as a modem or a LAN card, a wireless sending/receiving device such as a WIBRO interface, an infrared port, etc. In addition, the communication unit 550 may include a semiconductor device in accordance with any of the exemplary embodiments described herein or at least one semiconductor module 300 including the semiconductor device. The operation unit 560 may be physically or mechanically operated according to a command of the control unit 510. For example, the operation unit 560 may be a mechanically operated component such as a plotter, an indicator, an up/down operator, etc. The electronic system in accordance with an exemplary embodiment may be a computer, a network server, a network printer or scanner, a wired controller, a mobile communication terminal, an exchanger, or other electronic system operated by programs.

Names and functions of elements not designated by reference numerals will be readily understood from other drawings or descriptions thereof of the specification.

As can be seen from the foregoing, provision of a stable active isolation region and reduction in use of a silazene-based insulating material results in improvement in the performance of semiconductor devices and increased productivity.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments described, and that modifications to the described embodiments, as well as other embodiments, are intended to be included within the scope of the appended claims.

What is claimed is:

1. A semiconductor device comprising:
a semiconductor substrate having a cell region and a peripheral region, the cell region including a cell trench and the peripheral region including a peripheral trench,
wherein the cell trench is filled with a first core insulating material layer including silazene, the first core insulating material layer having a relatively high fluidity,
wherein the peripheral trench is filled with: i) a padding insulating material layer conformably formed on an inner surface of the peripheral trench, the padding insulating material layer including silicate and having a relatively low fluidity, and ii) a second core insulating material layer formed on an inner surface of the padding insulating material layer, the second core insulating material layer including silazene and having a relatively high fluidity.

2. The semiconductor device according to claim 1, further comprising a lining insulating material layer conformably formed between the semiconductor substrate and the padding insulating material layer in the peripheral trench.

3. The semiconductor device according to claim 2, wherein the lining insulating material layer comprises a silicon oxide layer.

4. The semiconductor device according to claim 1, wherein the silicate-based insulating material is undoped silicate glass (USG).

5. The semiconductor device according to claim 1, wherein the silazene-based insulating material comprises tonen silazene (TOSZ).

6. The semiconductor device according to claim 1, further comprising:
a first insulating material layer formed on the semiconductor substrate; and
a first conductive material layer formed on the first insulating material layer.

7. The semiconductor device according to claim 6, wherein the cell trench extends into the semiconductor substrate and electrically isolate the first conductive material layer.

8. A semiconductor device comprising:
a semiconductor substrate having a cell region and a peripheral region,
wherein the cell region comprises:
a tunnel insulating layer formed on the semiconductor substrate;
a floating gate electrode formed on the tunnel insulating layer; and
a cell trench vertically passing through the floating gate electrode and the tunnel insulating layer and extending into the semiconductor substrate, the cell trench being filled with a silazene-based material, and
wherein the peripheral region comprises:
a peripheral gate insulating layer formed on the semiconductor substrate;
a peripheral gate electrode formed on the peripheral gate insulating layer; and
a peripheral trench vertically passing through the peripheral gate electrode and the peripheral gate insulating layer and extending into the semiconductor substrate, the peripheral trench being filled with a silicon oxide layer conformably formed on the semiconductor substrate, a silicate-based insulating material layer conformably formed on the silicon oxide layer, and a silazene-based insulating material formed on the silicate-based silicate material layer.

9. The semiconductor device according to claim 8, wherein the cell trench and sidewalls of the tunnel insulating layer are vertically aligned.

10. The semiconductor device according to claim 1, wherein the first core insulating material layer and the second core insulating material layer are the same material.

11. A semiconductor device comprising:
a substrate having a first trench and a second trench, the second trench being wider than the first trench;
wherein the first trench is filled with a first silazene material, and
wherein the second trench is filled with:
an oxidized layer on an inner wall of the second trench,
a silicate layer conformably formed on the oxidized layer, and
a second silazene layer on the silicate layer to fill the second trench.

12. The semiconductor device according to claim 11, wherein the oxidized layer comprises oxidized silicon.

13. The semiconductor device according to claim 12, wherein the oxidized silicon is formed by oxidizing a surface of the inner wall of the second trench.

* * * * *